(12) United States Patent
Mylly et al.

(10) Patent No.: US 10,877,665 B2
(45) Date of Patent: Dec. 29, 2020

(54) APPARATUS AND METHOD TO PROVIDE CACHE MOVE WITH NON-VOLATILE MASS MEMORY SYSTEM

(71) Applicant: Memory Technologies LLC, Las Vegas, NV (US)

(72) Inventors: Kimmo J. Mylly, Ylojarvi (FI); Jani J. Klint, Kangasala (FI); Jani Hyvonen, Tampere (FI); Tapio Hill, Helsinki (FI); Jukka-Pekka Vihmalo, Tampere (FI); Matti K. Floman, Kangasala (FI)

(73) Assignee: Memory Technologies LLC, Kirkland, WA (US)

( * ) Notice: Subject to any disclaimer, the term of this patent is extended or adjusted under 35 U.S.C. 154(b) by 114 days.

(21) Appl. No.: 15/235,425

(22) Filed: Aug. 12, 2016

(65) Prior Publication Data
US 2017/0038975 A1 Feb. 9, 2017

Related U.S. Application Data

(63) Continuation of application No. 13/358,806, filed on Jan. 26, 2012, now Pat. No. 9,417,998.

(51) Int. Cl.
*G06F 12/00* (2006.01)
*G06F 3/06* (2006.01)
(Continued)

(52) U.S. Cl.
CPC .......... *G06F 3/0607* (2013.01); *G06F 3/0659* (2013.01); *G06F 3/0688* (2013.01);
(Continued)

(58) Field of Classification Search
CPC .... G06F 3/0607; G06F 3/0659; G06F 3/0688; G06F 12/0246; G06F 12/0804; G06F 12/0868; G06F 12/0888; G06C 7/1072
See application file for complete search history.

(56) References Cited

U.S. PATENT DOCUMENTS 5,586,291 A   12/1996   Lasker et al.
5,701,516 A   12/1997   Cheng et al.
(Continued)

FOREIGN PATENT DOCUMENTS

CN   1517886 A   8/2004
CN   101278354 A   10/2008
(Continued)

OTHER PUBLICATIONS

The Chinese Office Action dated Jun. 20, 2017 for Chinese Patent Application No. 201380006769.8, a counterpart foreign application of U.S. Pat. No. 9,417,998.
(Continued)

*Primary Examiner* — Prasith Thammavong
(74) *Attorney, Agent, or Firm* — Lee & Hayes, P.C.

(57) ABSTRACT

A method includes, in one non-limiting embodiment, receiving a command originating from an initiator at a controller associated with a non-volatile mass memory coupled with a host device, the command being a command to write data that is currently resident in a memory of the host device to the non-volatile mass memory; moving the data that is currently resident in the memory of the host device from an original location to a portion of the memory allocated for use at least by the non-volatile mass memory; and acknowledging to the initiator that the command to write the data to the non-volatile mass memory has been executed. An apparatus configured to perform the method is also described.

22 Claims, 10 Drawing Sheets

(51) Int. Cl.
  *G06F 12/02*    (2006.01)
  *G06F 12/0804*  (2016.01)
  *G06F 12/0868*  (2016.01)
  *G06F 12/0888*  (2016.01)
  *G11C 7/10*     (2006.01)

(52) U.S. Cl.
  CPC ...... *G06F 12/0246* (2013.01); *G06F 12/0804* (2013.01); *G06F 12/0868* (2013.01); *G06F 12/0888* (2013.01); *G11C 7/1072* (2013.01); *G06F 2212/1016* (2013.01); *G06F 2212/1024* (2013.01); *G06F 2212/1036* (2013.01); *G06F 2212/7202* (2013.01); *G06F 2212/7203* (2013.01); *G06F 2212/7206* (2013.01); *Y02D 10/00* (2018.01)

(56) References Cited

U.S. PATENT DOCUMENTS

| | | |
|---|---|---|
| 5,710,931 A | 1/1998 | Nakamura et al. |
| 5,781,753 A | 7/1998 | McFarland et al. |
| 5,802,069 A | 9/1998 | Coulson |
| 5,805,882 A | 9/1998 | Cooper et al. |
| 5,822,553 A | 10/1998 | Gifford et al. |
| 5,933,626 A | 8/1999 | Mahalingaiah et al. |
| 6,067,300 A | 5/2000 | Baumert et al. |
| 6,122,196 A | 9/2000 | Tanaka et al. |
| 6,173,425 B1 | 1/2001 | Knaack et al. |
| 6,226,710 B1 | 5/2001 | Melchior |
| 6,513,094 B1 | 1/2003 | Magro |
| 6,526,472 B2 | 2/2003 | Suzuki |
| 6,609,182 B1 | 8/2003 | Pedrizetti et al. |
| 6,665,747 B1 | 12/2003 | Nazari |
| 6,732,221 B2* | 5/2004 | Ban ............... G06F 12/0246 711/103 |
| 6,785,764 B1 | 8/2004 | Roohparvar |
| 6,842,829 B1 | 1/2005 | Nichols et al. |
| 6,901,298 B1 | 5/2005 | Govindaraj et al. |
| 7,047,368 B2 | 5/2006 | Vantalon et al. |
| 7,136,963 B2 | 11/2006 | Ogawa et al. |
| 7,181,574 B1 | 2/2007 | Lele |
| 7,321,958 B2 | 1/2008 | Hofstee et al. |
| 7,412,559 B2 | 8/2008 | Stockdale et al. |
| 7,480,749 B1 | 1/2009 | Danilak |
| 7,492,368 B1 | 2/2009 | Nordquist et al. |
| 7,571,295 B2 | 8/2009 | Sakarda et al. |
| 7,644,938 B2 | 1/2010 | Yamada |
| 7,730,248 B2 | 6/2010 | Goss et al. |
| 7,783,845 B2 | 8/2010 | Bennett et al. |
| 7,889,544 B2 | 2/2011 | Chow et al. |
| 8,094,500 B2 | 1/2012 | Paley et al. |
| 8,180,975 B2 | 5/2012 | Moscibroda et al. |
| 8,190,803 B2 | 5/2012 | Hobson et al. |
| 8,327,123 B2 | 12/2012 | Juffa et al. |
| 8,514,621 B2 | 8/2013 | Choi et al. |
| 8,527,693 B2 | 9/2013 | Flynn et al. |
| 8,639,874 B2 | 1/2014 | Maule et al. |
| 8,656,045 B2 | 2/2014 | Wallace et al. |
| 8,826,051 B2 | 9/2014 | Wakrat et al. |
| 8,879,346 B2 | 11/2014 | Kam et al. |
| 8,935,302 B2 | 1/2015 | Flynn et al. |
| 9,003,159 B2 | 4/2015 | Deshkar et al. |
| 9,063,724 B2 | 6/2015 | Smith et al. |
| 9,069,551 B2 | 6/2015 | Iarovici et al. |
| 9,128,718 B1 | 9/2015 | Lachwani et al. |
| 9,141,394 B2 | 9/2015 | Sakarda |
| 9,424,182 B2 | 8/2016 | Fisher et al. |
| 9,645,758 B2 | 5/2017 | Peterson et al. |
| 9,667,425 B2 | 5/2017 | Goss et al. |
| 9,710,377 B1* | 7/2017 | Kuzmin ............... G06F 8/654 |
| 9,727,454 B2 | 8/2017 | Kuzmin et al. |
| 9,829,951 B2 | 11/2017 | Kumar et al. |
| 9,841,911 B2* | 12/2017 | Yu ................... G06F 3/0619 |
| 9,870,327 B2 | 1/2018 | Chen et al. |
| 9,941,007 B2 | 4/2018 | Peddle et al. |
| 9,952,977 B2 | 4/2018 | Heinrich et al. |
| 10,095,613 B2 | 10/2018 | Jo et al. |
| 2002/0000931 A1 | 1/2002 | Petronic et al. |
| 2002/0108014 A1 | 8/2002 | Lasser |
| 2003/0028737 A1 | 2/2003 | Kaiya et al. |
| 2003/0137860 A1 | 7/2003 | Khatri et al. |
| 2004/0010671 A1 | 1/2004 | Sampsa et al. |
| 2004/0203670 A1 | 10/2004 | King et al. |
| 2004/0221124 A1 | 11/2004 | Beckert et al. |
| 2005/0010738 A1 | 1/2005 | Stockdale et al. |
| 2005/0071570 A1 | 3/2005 | Takasugl et al. |
| 2005/0097280 A1 | 5/2005 | Hofstee et al. |
| 2005/0138318 A1* | 6/2005 | Ash ................. G06F 3/061 711/170 |
| 2005/0204113 A1 | 9/2005 | Harper et al. |
| 2006/0041888 A1 | 2/2006 | Radulescu et al. |
| 2006/0069899 A1 | 3/2006 | Schoinas et al. |
| 2006/0075147 A1 | 4/2006 | Schoinas et al. |
| 2006/0075395 A1 | 4/2006 | Lee et al. |
| 2006/0119602 A1* | 6/2006 | Fisher ................. G06T 1/20 345/441 |
| 2006/0120235 A1* | 6/2006 | Jensen ............. G06F 3/0623 369/47.1 |
| 2006/0129722 A1 | 6/2006 | Campbell |
| 2007/0088867 A1 | 4/2007 | Cho et al. |
| 2007/0136523 A1 | 6/2007 | Bonella et al. |
| 2007/0147115 A1 | 6/2007 | Lin et al. |
| 2007/0226795 A1 | 9/2007 | Conti et al. |
| 2007/0234006 A1 | 10/2007 | Radulescu et al. |
| 2007/0283078 A1 | 12/2007 | Li et al. |
| 2008/0127131 A1 | 5/2008 | Gao et al. |
| 2008/0162792 A1 | 7/2008 | Wu et al. |
| 2008/0228984 A1 | 9/2008 | Yu et al. |
| 2008/0235477 A1* | 9/2008 | Rawson ............ G06F 12/1036 711/165 |
| 2008/0281944 A1 | 11/2008 | Vorne et al. |
| 2009/0106503 A1 | 4/2009 | Lee et al. |
| 2009/0157950 A1 | 6/2009 | Selinger |
| 2009/0182940 A1 | 7/2009 | Matsuda et al. |
| 2009/0182962 A1 | 7/2009 | Khmelnitsky et al. |
| 2009/0198871 A1 | 8/2009 | Tzeng |
| 2009/0198872 A1 | 8/2009 | Tzeng |
| 2009/0216937 A1 | 8/2009 | Yasufuku |
| 2009/0222629 A1 | 9/2009 | Yano et al. |
| 2009/0292861 A1 | 11/2009 | Kanevsky et al. |
| 2009/0307377 A1 | 12/2009 | Anderson et al. |
| 2009/0307544 A1* | 12/2009 | Kim ................... G11C 29/56 714/719 |
| 2009/0327584 A1 | 12/2009 | Tetrick et al. |
| 2010/0005281 A1 | 1/2010 | Buchmann et al. |
| 2010/0037012 A1 | 2/2010 | Yano et al. |
| 2010/0082905 A1 | 4/2010 | Wilkerson et al. |
| 2010/0100648 A1 | 4/2010 | Madukkarumukumana et al. |
| 2010/0106886 A1 | 4/2010 | Marcu et al. |
| 2010/0115193 A1 | 5/2010 | Manus et al. |
| 2010/0161882 A1 | 6/2010 | Stern et al. |
| 2010/0169558 A1 | 7/2010 | Honda et al. |
| 2010/0172180 A1 | 7/2010 | Paley et al. |
| 2010/0250836 A1 | 9/2010 | Sokolov et al. |
| 2010/0293420 A1 | 11/2010 | Kapil et al. |
| 2010/0306503 A1* | 12/2010 | Henry ................ G06F 12/0862 712/207 |
| 2010/0312947 A1 | 12/2010 | Luukkainen et al. |
| 2011/0029808 A1* | 2/2011 | Moshayedi .......... G06F 11/1068 714/710 |
| 2011/0082967 A1 | 4/2011 | Deshkar et al. |
| 2011/0087804 A1 | 4/2011 | Okaue et al. |
| 2011/0208914 A1 | 8/2011 | Winokur et al. |
| 2011/0264860 A1 | 10/2011 | Hooker et al. |
| 2011/0296088 A1 | 12/2011 | Duzly et al. |
| 2012/0023303 A1* | 1/2012 | Russo ................. G06F 21/79 711/166 |
| 2012/0102268 A1 | 4/2012 | Smith et al. |
| 2012/0131263 A1 | 5/2012 | Yeh |
| 2012/0131269 A1 | 5/2012 | Fisher et al. |
| 2012/0151118 A1 | 6/2012 | Flynn et al. |
| 2012/0210326 A1 | 8/2012 | Torr et al. |

(56) References Cited

U.S. PATENT DOCUMENTS

| | | | |
|---|---|---|---|
| 2012/0221875 | A1 | 8/2012 | Bak et al. |
| 2012/0239990 | A1* | 9/2012 | Mataya ............... G06F 12/0866 714/704 |
| 2012/0324299 | A1* | 12/2012 | Moshayedi ......... G06F 11/1068 714/710 |
| 2013/0138840 | A1 | 5/2013 | Kegel et al. |
| 2013/0145055 | A1 | 6/2013 | Kegel et al. |
| 2013/0346685 | A1* | 12/2013 | Hampel .................. G11C 7/10 711/105 |
| 2014/0059273 | A1 | 2/2014 | Fujimoto et al. |
| 2014/0068140 | A1 | 3/2014 | Mylly |
| 2014/0304475 | A1 | 10/2014 | Ramanujan et al. |
| 2015/0039819 | A1 | 2/2015 | Luukkainen et al. |
| 2015/0134871 | A1* | 5/2015 | Benisty ............... G06F 13/1673 710/308 |
| 2016/0077963 | A1 | 3/2016 | Luukkainen et al. |
| 2016/0306588 | A1* | 10/2016 | Li ........................... G06F 3/064 |
| 2017/0046067 | A1 | 2/2017 | Luukkainen et al. |
| 2018/0130506 | A1* | 5/2018 | Kang ..................... G11C 16/10 |
| 2018/0137058 | A1* | 5/2018 | Heo ........................ G06F 13/28 |
| 2018/0364909 | A1 | 12/2018 | Luukkainen et al. |
| 2019/0034122 | A1 | 1/2019 | Mylly |
| 2020/0089403 | A1 | 3/2020 | Hyvonen et al. |

FOREIGN PATENT DOCUMENTS

| | | |
|---|---|---|
| CN | 101449251 A | 6/2009 |
| CN | 101667103 A | 3/2010 |
| CN | 101714106 A | 5/2010 |
| CN | 101887350 | 11/2010 |
| EP | 0749063 A2 | 12/1996 |
| EP | 1091283 | 4/2001 |
| EP | 1094392 A1 | 4/2001 |
| EP | 1779241 | 2/2006 |
| JP | S6464073 A | 3/1989 |
| JP | H02170767 A | 7/1990 |
| JP | H11259357 | 9/1990 |
| JP | 06124596 | 5/1994 |
| JP | H06124596 A | 5/1994 |
| JP | H08123731 A | 5/1996 |
| JP | H08161216 | 6/1996 |
| JP | H11242563 | 9/1999 |
| JP | 2000057039 | 2/2000 |
| JP | 2003150445 | 5/2003 |
| JP | 2004511030 | 4/2004 |
| JP | H03687115 B2 | 8/2005 |
| JP | 2006011818 | 1/2006 |
| JP | 2006331408 | 12/2006 |
| JP | 2006343923 | 12/2006 |
| JP | 2007052717 | 3/2007 |
| JP | 2007183962 A | 7/2007 |
| JP | 3965874 B2 | 8/2007 |
| JP | 2011022657 | 2/2011 |
| JP | 2011028537 | 2/2011 |
| JP | 2011039849 | 2/2011 |
| JP | 2011086064 | 4/2011 |
| JP | 2011238175 | 11/2011 |
| JP | 2013504815 A | 2/2013 |
| JP | 2013109419 | 6/2013 |
| JP | 2013176088 A | 9/2013 |
| KR | 20090033887 A | 4/2007 |
| KR | 100842140 B1 | 6/2008 |
| KR | 20100072068 A | 6/2010 |
| WO | WO 88/01772 | 3/1988 |
| WO | WO99/65193 | 12/1999 |
| WO | WO01/35200 A1 | 5/2001 |
| WO | 2002526875 A | 8/2002 |
| WO | WO2004084231 A1 | 9/2004 |
| WO | WO2011013350 | 3/2011 |

OTHER PUBLICATIONS

The Japanese Office Action dated Dec. 20, 2016 for Japanese Patent Application No. 2014-553773, a counterpart foreign application of U.S. Pat. No. 9,417,998.

Translated the Japanese Office Action dated Mar. 27, 2018 for Japanese patent application No. 2017-155752, a counterpart foreign application of U.S. Pat. No. 9,417,998, 7 pgs.

Office Action for U.S. Appl. No. 15/335,688, dated Mar. 24, 2017, Olli Luukkainen, "Apparatus and Method to Share Host System RAM with Mass Storage Memory RAM", 5 pages.

Apostolakis, et al., "Software-Based Self Testing of Symmetric Shared-Memory Multiprocessors", IEEE Transactions on Computers, vol. 58, No. 12, Dec. 2009, 13 pages.

Translated Chinese Office Action dated Mar. 28, 2016 for Chinese Patent Application No. 201380006769.8, a counterpart foreign application of U.S. Appl. No. 13/358,806, 36 pages.

"Embedded MultiMediaCard (eMMC) Mechanical Standard", JESD84-C43, JEDEC Standard, JEDEC Solid State Technology Association, Jun. 2007, 13 pages.

The Extended European Search Report dated Aug. 31, 2015 for European patent application No. 13741595.6, a counterpart foreign application of U.S. Apppl. No. 13/358,806, 8 pages.

"How to Boot an Embedded System for an eMMC Equipped with a Microsoft FAT File System", AN2539 Numonyx Application Note, Nov. 2008, 25 pages.

JEDEC Standard, "Embedded MultiMediaCard (eMMC) Product Standard, High Capacity," JESD84-A42, Jun. 2007, 29 pages.

JEDEC Standard, "Embedded ZmultiMediaCard(eMMC) eMMC/Card Product Standard, high Capacity, Including Reliable Write, Boot, and Sleep Modes," (MMCA, 4.3), JSEDD84-A43, Nov. 2007, 166 pages.

JEDEC Standard, "Embedded MultiMediaCard (eMMC) Mechanical Standard," JESD84-C43, Jun. 2007, 13 pages.

Li, et al., "A Method for Improving Concurrent Write Performance by Dynamic Mapping Virtual Storage System Combined with Cache Management", 2011 IEEE 7th International Conference of Parallel Distributed System, Dec. 7-8, 2011, 10 pages.

Lin, et al., "A NAND Flash Memory Controller for SD/MMC Flash Memory Card", IEEE Transactions on Magnetics, vol. 43, No. 2, Feb. 2007, pp. 933-935.

Numonyz, "How to boot an embedded system from an eMMCTM equipped with a Microsoft FAT file system." Application note AN2539, Nov. 2008, pp. 1-25.

Office action for U.S. Appl. No. 14/945,757, dated Jan. 21, 2016, Luukkainen et al., "Apparatus and Method to Share Host System RAM with Mass Storage Memory RAM", 16 pages.

Office Action for U.S. Appl. No. 13/358,806, dated Nov. 27, 2013, Kimmo J. Mylly, "Apparatus and Method to Provide Cache Move With Non-Volatile Mass Memory System", 26 pages.

Office action for U.S. Appl. No. 13/358,806, dated Nov. 6, 2015, Mylly et al., "Apparatus and Method to Provide Cache Move With Non-Volatile Mass Memory System", 44 pages.

Office Action for U.S. Appl. No. 14/520,030, dated Dec. 4, 2014, Olli Luukkainen, "Apparatus and Method to Share Host System RAM with Mass Storage Memory RAM", 6 pages.

Office Action for U.S. Appl. No. 13/596,480, dated Mar. 13, 2014, Kimmo J. Mylly, "Dynamic Central Cache Memory", 15 pages.

Office action for U.S. Appl. No. 12/455,763, dated Mar. 14, 2014, Luukkainen et al., "Apparatus and method to share host system ram with mass storage memory ram", 6 pages.

Office Action for U.S. Appl. No. 13/358,806, dated Apr. 30, 2015, Kimmo J. Mylly, "Apparatus and Method to Provide Cache Move With Non-Volatile Mass Memory System", 42 pages.

Final Office Action for U.S. Appl. No. 14/520,030, dated May 20, 2015, Olli Luukkaninen, "Apparatus and Method to Share Host System RAM with Mass Storage Memory RAM", 6 pages.

Office action for U.S. Appl. No. 12/455,763, dated Aug. 1, 2013, Luukkainen et al., "Apparatus and method to share host system ram with mass storage memory ram", 28 pages.

Final Office Action for U.S. Appl. No. 13/358,806, dated Sep. 10, 2014, Kimmo J. Mylly, "Apparatus and Method to Provide Cache Move With Non-Volatile Mass Memory System", 27 pages.

"PCI Local Bus Specification Revision 3.0", PCI-SGI, Feb. 3, 2004, 34-4 pages, pp. 238-246.

(56) References Cited

OTHER PUBLICATIONS

The PCT Search Report and Written Opinion dated Mar. 6, 2014 for PCT application No. PCT/US13/56980, 11 pages.
Tanenbaum, "Structured Computer Organization", Prentice-Hall, Inc, 1984, 5 pages.
Office action for U.S. Appl. No. 14/945,757, dated Jul. 28, 2016, Luukkainen et al., "Apparatus and Method to Share Host System RAM with Mass Storage Memory RAM", 5 pages.
The Japanese Office Action dated Oct. 1, 2018 for Japanese patent application No. 2017-156699, a counterpart foreign application of U.S. Pat. No. 8,307,180, 11 pages.
Office Action for U.S. Appl. No. 15/181,293, dated Oct. 4, 2018, Hyvonen et al, "Extended Utilization Area for a Memory Device", 5 pages.
Office action for U.S. Appl. No. 15/181,293, dated Apr. 18, 2018, Hyvonen et al., "Extended Utilization Area for a Memory Device", 11 page.
Office action for U.S. Appl. No. 15/989,695, dated Apr. 11, 2019, Luukkainen et al., "Apparatus and Method to Share Host System RAM with Mass Storage Memory RAM", 9 pages.
Office action for U.S. Appl. No. 15/181,293, dated Apr. 24, 2019, Hyvonen et al., "Extended Utilization Area for a Memory Device", 6 pages.
Translated Chinese Office Action dated Mar. 12, 2019 for Chinese Patent Application No. 201610905925.X, a counterpart of U.S. Appl. No. 13/451,951, 7 pages.
The Extended European Search Report dated May 8, 2019 for European Patent Application No. 18215330.4, 8 pages.
"1G×8 Bit / 2G×8 Bit / 4G×8 Bit NAND Flash Memory", Nov. 4, 2005, Samsung Electronics—K9XXG08UXM. 50 Pages.
The Japanese Office Action dated Jul. 29, 2019 for Japanese patent application No. 2017-156699, a counterpart foreign application of U.S. Pat. No. 8,307,180.
The Korean Office Action dated May 29, 2019 for Korean Patent Application No. 2014-7019265, a counterpart of U.S. Pat. No. 9,417,998, 17 pages.
"SD Specifications : Part 1 Physical Layer Specification" Oct. 15, 2004, Version 1.10, SD Group (MEI, ScanDisk, Toshiba) and SD Card Association, 164 pages.

The European Office Action dated Jan. 8, 2020 for European Patent Application No. 18213772.9, a counterpart foreign application of U.S. Appl. No. 13/358,806, 7 pages.
The Extended European Search Report dated Mar. 22, 2019 for European Patent Application No. 18213772, 8 pages.
The Chinese Office Action dated Sep. 16, 2019 for Chinese Patent Application No. 201610905925X, a counterpart of U.S. Pat. No. 9,311,226, 6 pages.
Office Action for U.S. Appl. No. 15/989,695, dated Oct. 10, 2019, Luukkainen, "Apparatus and Method to Share Host System RAM With Mass Storage Memory RAM", 9 pages.
Office Action for U.S. Appl. No. 16/054,582, dated Nov. 15, 2019, Mylly, "Managing Operational State Data in Memory Module", 7 pages.
Pedersen, Lynne; Design for MISP: A Multiple Instruction Stream Shared Pipeline Processor; University of Illinois at Urbana-Champaign, 1985 (201 pages).
Powers, Susan et al; AS/400 Disk Storage Topics and Tools; International Technical Support Organization; International Business Machines; Apr. 2000 (252 pages).
The Taiwanese Office Action dated Jul. 16, 2019 for Taiwanese Patent Application No. 107132459, a counterpart of U.S. Pat. No. 9,311,226, 5 pages.
Chinese Office Action dated Mar. 3, 2020, for the Chinese Patent Application No. 201610905925.X, a counterpart foreign application of the U.S. Appl. No. 13/451,951, 11 pages.
Extended European Search Report dated Apr. 1, 2019 for European Patent Application No. 18213772, 9 pages.
Japanese Office Action dated Jun. 9, 2020 for Japanese Patent Application No. 2018-219218, a counterpart of U.S. Pat. No. 9,417,998, 1 page.
U.S. Office Action dated Mar. 5, 2020 for U.S. Appl. No. 15/989,695 "Apparatus and Method to Share Host System RAM With Mass Storage Memory RAM" Luukkainen, 9 pages.
U.S. Office Action dated Mar. 5, 2020 for U.S. Appl. No. 16/054,582 "Managing Operational State Data in Memory Module" Mylly, 8 pages.
Taiwanese Office Action dated Juen 15, 2020 for Taiwanese Patent Application No. 107132459, a counterpart of U.S. Pat. No. 9,311,226, 4 pages.
Korean Office Action dated Oct. 12, 2020 for Korean Patent Application No. 2020-7018006, a counterpart of U.S. Pat. No. 9,417,998, 14 pages.

* cited by examiner

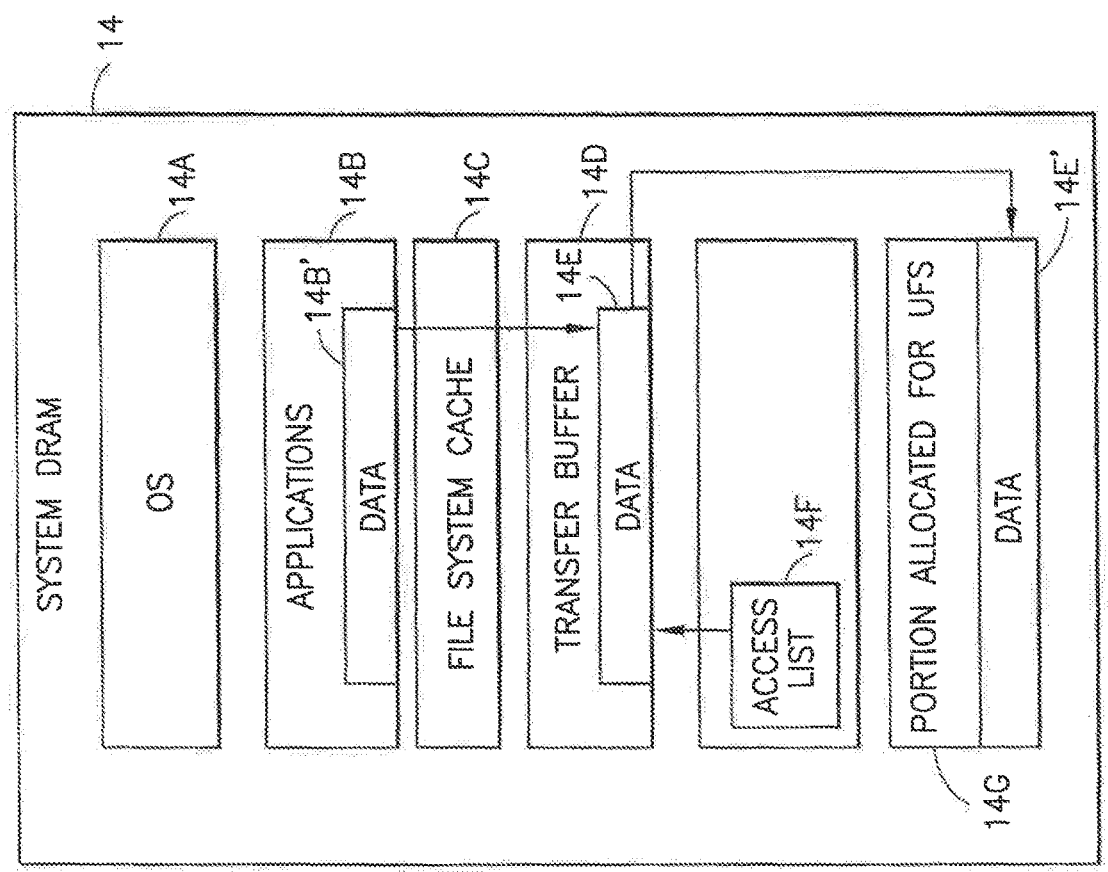

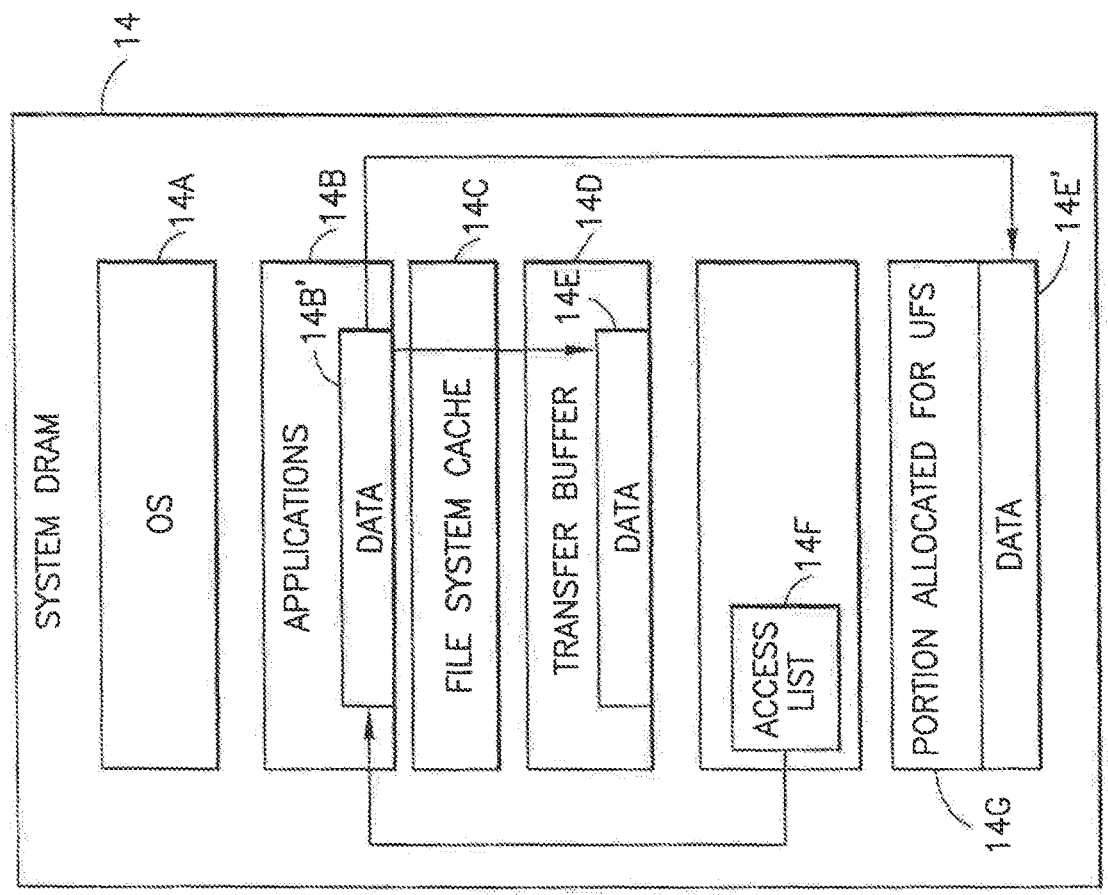

APPARATUS AND METHOD TO PROVIDE CACHE MOVE WITH NON-VOLATILE MASS MEMORY SYSTEM

CROSS REFERENCE TO RELATED APPLICATIONS

This is a continuation of and claims priority to commonly assigned, co-pending U.S. patent application Ser. No. 13/358,806, filed Jan. 26, 2012, which is fully incorporated herein by reference.

TECHNICAL FIELD

The exemplary and non-limiting embodiments of this invention relate generally to memory storage systems, methods, devices and computer programs and, more specifically, relate to mass memory devices, such as those containing non-volatile flash memory.

BACKGROUND

This section is intended to provide a background or context to the invention that is recited in the claims. The description herein may include concepts that could be pursued, but are not necessarily ones that have been previously conceived, implemented or described. Therefore, unless otherwise indicated herein, what is described in this section is not prior art to the description and claims in this application and is not admitted to be prior art by inclusion in this section.

The following abbreviations that may be found in the specification and/or the drawing figures are defined as follows:
ASIC application specific integrated circuit
CPU central processing unit
DMA direct memory access
eMMC embedded multimedia card
exFAT extended file allocation table
HW hardware
JEDEC Joint Electron Device Engineering Council
LBA logical block address
MMC MultiMediaCard
MRAM magnetic random access memory
RAM random access memory
SCSI small computer system interface
SD secure digital
SW software
UFS universal flash storage Various types of flash-based mass storage memories currently exist. A basic premise of mass storage memory is to hide the flash technology complexity from the host system. A technology such as eMMC is one example. A managed NAND type of memory can be, for example, an eMMC, SSD, UFS or a microSD.

FIG. 1A reproduces FIG. 2 from JEDEC Standard, Embedded MultiMediaCard (eMMC) Product Standard, High Capacity, JESD84-A42, June 2007, JEDEC Solid State Technology Association, and shows a functional block diagram of an eMMC. The JEDEC eMMC includes, in addition to the flash memory itself, an intelligent on-board controller that manages the MMC communication protocol. The controller also handles block-management functions such as logical block allocation and wear leveling. The interface includes a clock (CLK) input. Also included is a command (CMD), which is a bidirectional command channel used for device initialization and command transfers. Commands are sent from a bus master to the device, and responses are sent from the device to the host. Also included is a bidirectional data bus (DAT[7:0]). The DAT signals operate in push-pull mode. By default, after power-up or RESET, only DAT0 is used for data transfer. The memory controller can configure a wider data bus for data transfer using either DAT[3:0] (4-bit mode) or DAT[7:0] (8-bit mode).

One non-limiting example of a flash memory controller construction is described in "A NAND Flash Memory Controller for SD/MMC Flash Memory Card", Chuan-Sheng Lin and Lan-Rong Dung, IEEE Transactions of Magnetics, Vol. 43, No. 2, February 2007, pp. 933-935 (hereafter referred to as Lin et al.) FIG. 1B reproduces FIG. 1 of Lin et al., and shows an overall block diagram of the NAND flash controller architecture for a SD/MMC card. The particular controller illustrated happens to use a w-bit parallel Bose-Chaudhuri-Hocquengham (BCH) error-correction code (ECC) designed to correct random bit errors of the flash memory, in conjunction with a code-banking mechanism.

SUMMARY

In a first aspect thereof the exemplary embodiments of this invention provide a method that comprises receiving a command originating from an initiator at a controller associated with a non-volatile mass memory coupled with a host device, the command being a command to write data that is currently resident in a memory of the host device to the non-volatile mass memory; moving the data that is currently resident in the memory of the host device from an original location to a portion of the memory allocated for use at least by the non-volatile mass memory; and acknowledging to the initiator that the command to write the data to the non-volatile mass memory has been executed.

In another aspect thereof the exemplary embodiments of this invention provide an apparatus that comprises a controller associated with a non-volatile memory module connected with a host device and an interface to the non-volatile mass memory module. The controller is configurable to process a command originating with an initiator, where the command is a command to write data that is currently resident in a memory of the host device to the non-volatile mass memory module. The controller is further configurable to move the data that is currently resident in the memory of the host device from an original location to a portion of the memory allocated for use at least by the non-volatile mass memory module; and to acknowledge to the initiator that the command to write the data to the non-volatile mass memory has been executed.

In another aspect thereof the exemplary embodiments of this invention provide a method that comprises providing a data processing system comprising at least one data processor and at least one memory comprised of dynamic random access memory, and autonomously performing an elementary memory operation in the memory.

In yet another aspect thereof the exemplary embodiments of this invention provide a memory module that comprises a controller; a non-volatile mass memory that is readable and writable by the controller; and an interface for connecting the memory module to a host device. The controller is configurable to receive a command originating from an initiator, where the command being a command to write data that is currently resident in a memory of the host device to the non-volatile mass memory module. The controller is further configurable to initiate the move of the data that is currently resident in the memory of the host device from an original location to a portion of the memory allocated for use at least by the non-volatile mass memory module; and to acknowledge to the initiator that the command to write the data to the non-volatile mass memory has been executed.

BRIEF DESCRIPTION OF THE DRAWINGS

In the attached Drawing Figures:

FIGS. 5A, 5B and 5C, collectively referred to as FIG. 5, show an embodiment of the host device and mass storage memory device of FIG. 2 in accordance with embodiments of this invention.

DETAILED DESCRIPTION

Of interest to the ensuing description of the exemplary embodiments of this invention is commonly-assigned U.S. patent application Ser. No. 12/455,763, filed Jun. 4, 2009, "Apparatus and Method to Share Host System RAM with Mass Storage Memory RAM", Olli Luukkainen, Kimmo Mylly and Jani Hyvonen (US 2010/0312947 A1), incorporated by reference herein. Before describing in detail the exemplary embodiments of this invention it will be useful to review at least a portion of the description of this commonly-assigned U.S. patent application Ser. No. 12/455,763.

As is stated, at present most mass storage memories provide LBA-based access, e.g., eMMC and different types of external memory cards such as SD. However, it may also be the case that the entire file system (FS) SW is embedded in the mass storage memory device.

When a mass storage memory is used in a high volume consumer device, such as a mobile wireless communication device, one important consideration is cost, and one factor affecting the cost is the amount of RAM in the mass storage memory device itself.

Another important consideration is performance. The overall performance depends on many factors. For example, for lengthy (time consuming) operations (in particular if the mass storage memory device contains an entire file system SW) there would be an advantage to include a substantial amount of RAM in the mass storage memory device. However, this can have a negative impact on the cost.

It may be the case that system context (metadata) would be stored in the flash memory of the mass storage memory device. However, this approach has several associated disadvantages. For example, repeatedly writing the system context (metadata) to the mass storage memory device raises wearing issues that can impact the usable life of the mass storage memory device. Also, writing data to the flash memory can be a relatively slow process.

Another important consideration is the power efficiency. To provide good power efficiency the mass storage memories are preferably shutdown (powered-off) when not needed (meaning also that the internal RAM of the device is preferably shutdown as well). However, and assuming that the RAM is volatile in nature, then whatever data is stored in the RAM is lost when the power is removed from the RAM. To then perform re-initialization after power-up all needed information (e.g., logical-to-physical mapping information and/or file system structures) need to be restored. A full re-initialization of a LBA mass storage memory may require a substantial (and user-noticeable) amount of time (e.g., up to one second with an SD card), and entire file system initialization (if the file system is resident in the mass storage memory) may take even longer. Therefore, it is desirable to retain internal device context over the power-off/power-on cycle.

Figure 1A:
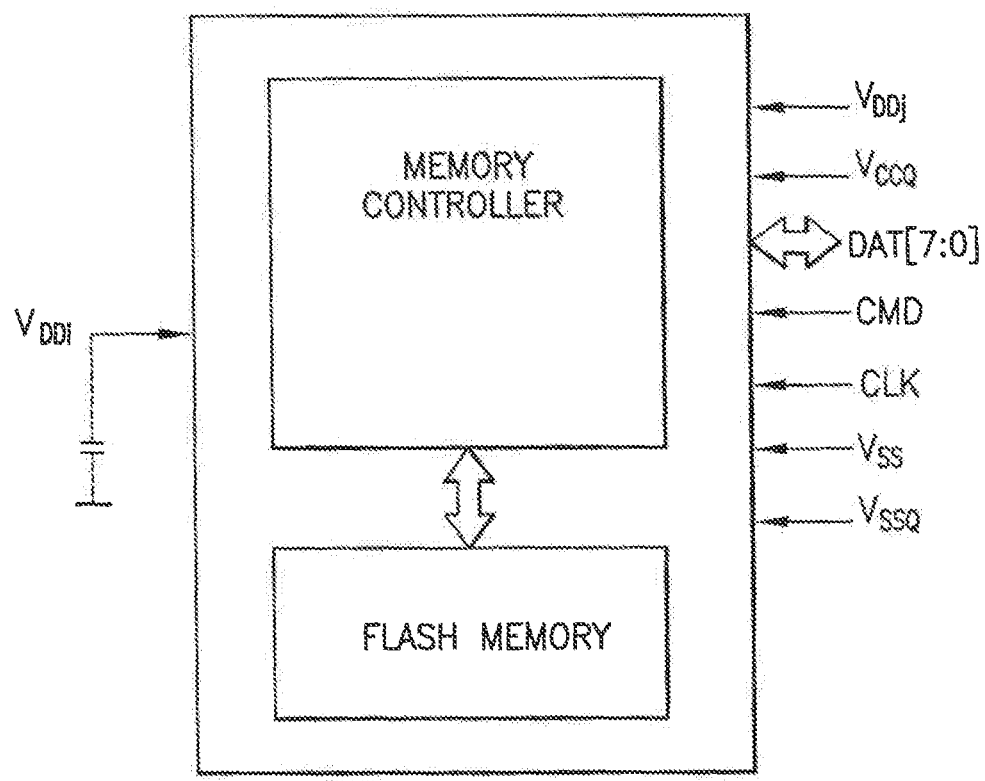
FIG. 1A reproduces FIG. 2 from JEDEC Standard, Embedded MultiMediaCard (eMMC) Product Standard, High Capacity, JESD84-A42, June 2007, JEDEC Solid State Technology Association, and shows a functional block diagram of an eMMC.
Figure 1B:
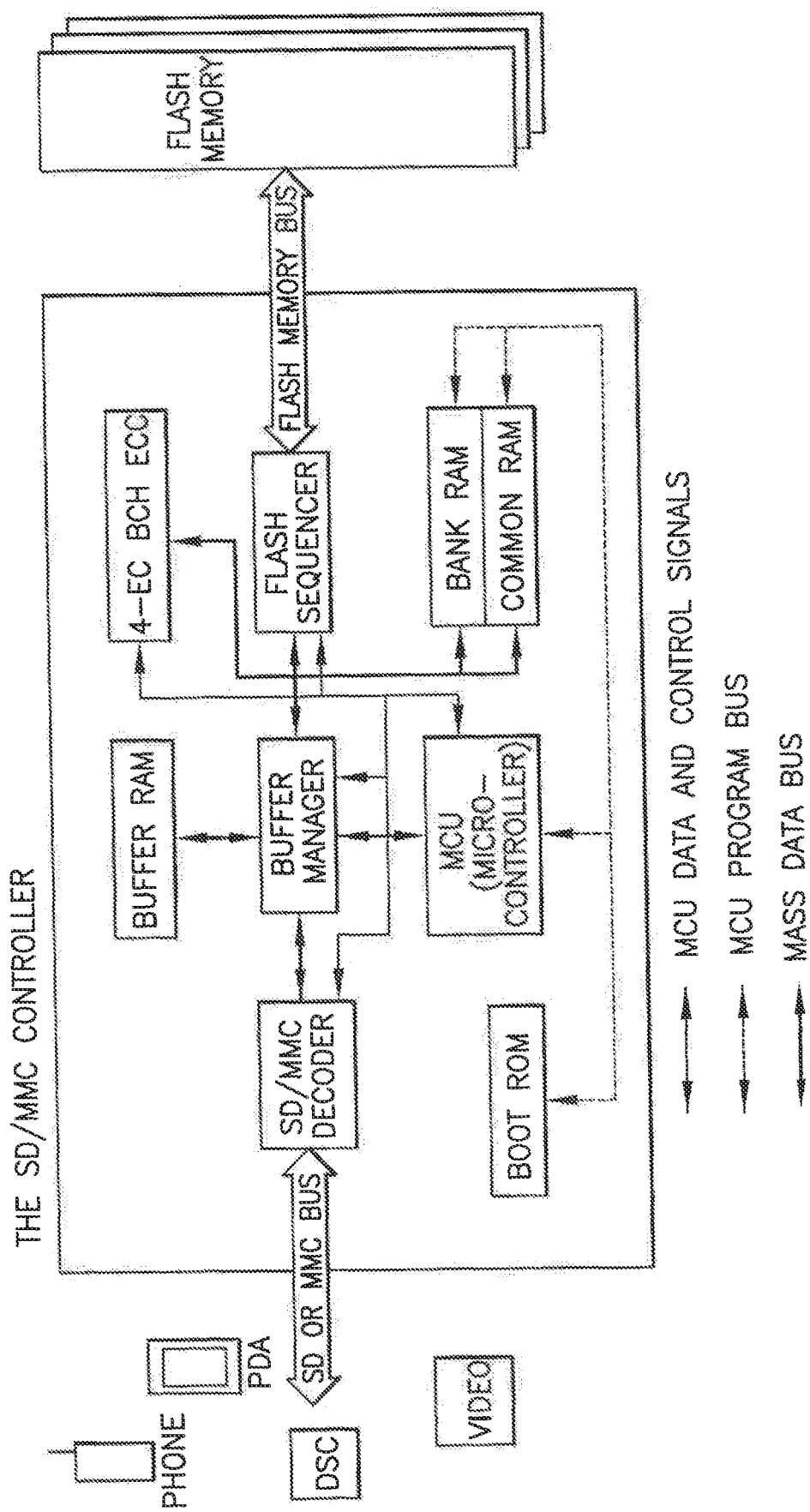
FIG. 1B reproduces FIG. 1 of Lin et al., and shows an example of an overall block diagram of a NAND flash controller architecture for a SD/MMC card.
Figure 2:
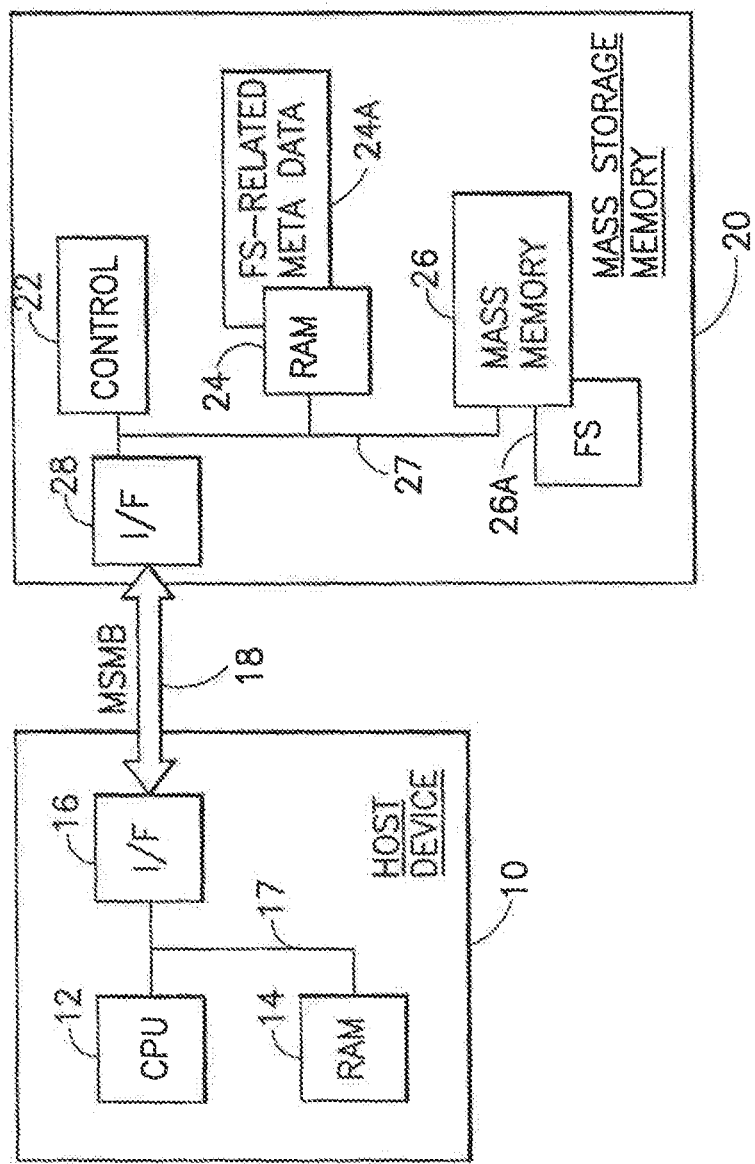
FIG. 2 is a simplified block diagram of a host device connected with a mass storage memory device, and is helpful in describing the exemplary embodiments of this invention.

FIG. 2 shows is a simplified block diagram of a host system or device 10 connected with a mass storage memory 20 via a mass storage memory bus (MSMB) 18. The MSMB 18 may be compatible with any suitable mass memory interface standard such as MMC or UFS, as two non-limiting examples. The MSMB 18 may include signal lines such as those shown in FIG. 1A for an eMMC embodiment. The host device 10 includes at least one controller, such as a CPU 12 that operates in accordance with stored program instructions. The program instructions may be stored in a RAM 14 or in another memory or memories. The CPU 12 is connected with the RAM 14 and a MSMB interface (I/F) 16 via at least one internal bus 17. The MSMB interface 16 may include a memory controller (MC), or may be coupled with a MC unit associated with the CPU 12. The host device 10 may be a computer, a cellular phone, a digital camera, a gaming device or a PDA, as several non-limiting examples. Note that the RAM 14 may be any read/write memory or memory device, such as semiconductor memory or a disk-based memory.

The mass storage memory 20 includes a microcontroller or, more simply, a controller 22 that is connected via at least one internal bus 27 with a volatile RAM 24, a non-volatile mass memory 26 (e.g., a multi-gigabyte flash memory mass storage) and a MSMB interface (I/F) 28. The controller 22 operates in accordance with stored program instructions. The program instructions may be stored in the RAM 24 or in a ROM or in the mass memory 26. The mass storage memory 20 may be embodied as an MMC, eMMC or a SD device, as non-limiting examples, and may be external to (plugged into) the host device 10 or installed within the host device 10. Note that the mass memory 26 may, in some embodiments, store a file system (FS) 26A. In this case then the RAM 24 may store FS-related metadata 24A, such as one or more data structures comprised of bit maps, file allocation table data and/or other FS-associated information.

The embodiments of the invention described in commonly-assigned U.S. patent application Ser. No. 12/455,763 provide a technique to share the RAM 14 of the host device 10 with the mass storage memory device 20. It can be assumed that the host device 10 (e.g., a mobile computer, a cellular phone, a digital camera, a gaming device, a PDA, etc.) has the capability to allocate and de-allocate the RAM 14. The allocation of the RAM 14 may be performed dynamically or it may be performed statically. The allocation of a portion of the RAM may be performed in response to a request received at the host device 10, or at the initiative of the host device 10.

In the embodiments of the invention described in commonly-assigned U.S. patent application Ser. No. 12/455,763 the RAM 14 allocation is provided for the mass storage memory 20 (connected via the MSMB 18 to the host CPU 12), if the mass storage memory 20 has a need to extend its own RAM 24 space and/or if the mass storage memory 20 has a need for non-volatile RAM (the contents of which are not lost when the mass storage memory 20 is powered-off). The mass storage memory 20 can also read and/or write (R/W) allocated RAM 14 in the host device 10. The allocation/de-allocation and R/W access methods can be implemented by extensions to a command set used to communicate with the mass storage memory 20 via an applicable mass storage memory protocol.

Figure 3:
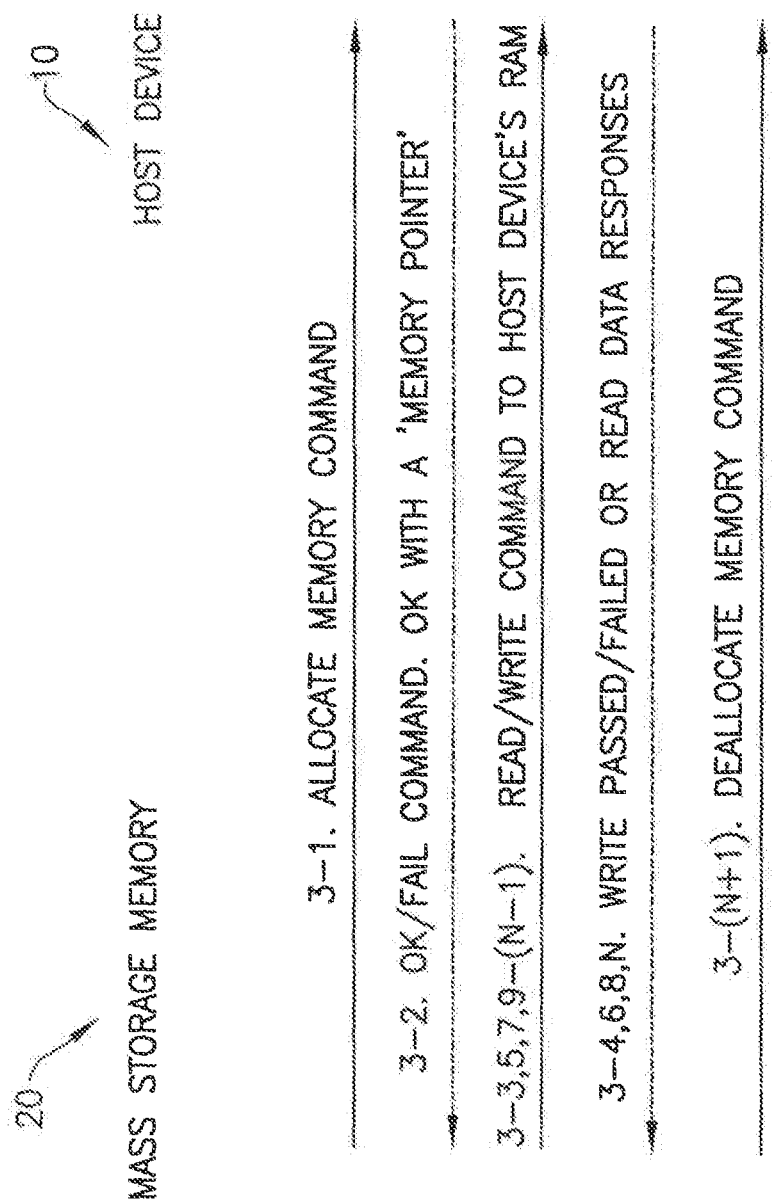
FIG. 3 is a signal/message flow diagram that describes an embodiment of the invention described in commonly-assigned U.S. patent application Ser. No. 12/455,763, where the mass storage memory device of FIG. 2 can allocate, use and de-allocate RAM of the host device.

In accordance with certain embodiments of the invention described in commonly-assigned U.S. patent application Ser. No. 12/455,763 the mass storage memory device 20 is provided with a mechanism to interrupt/send a message to host device 10 to initiate an allocation of space in the RAM 14. The interrupt/message is sent over the MSMB 18, and may be considered as an extension to current command sets. Referring to FIG. 3, an allocate memory command is sent during operation 3-1. If the allocation request succeeds (indicated during operation 3-2) the controller 22 is enabled to extend its own RAM 24 with the RAM 14 of the host device 10. The mass storage memory device 20 may store, for example, large tables into the RAM 14 using a RAM WRITE command or it may fetch data from the host device RAM 14 using a RAM READ command. The read or write operation is shown as interleaved operations 3-3, 3-4, 3-5, 3-6, . . . , 3-(N−1), 3-N. When the mass storage memory device 20 completes the operation with the RAM 14 it may free the host device RAM 14 using another command that requests that the host 10 RAM memory be de-allocated (operation 3-(N+1)).

Figure 4:
FIG. 4 is a signal/message flow diagram that describes another embodiment of the invention described in commonly-assigned U.S. patent application Ser. No. 12/455,763, where the mass storage memory device of FIG. 2 has a built-in file system.

FIG. 4 illustrates a further exemplary embodiment described in commonly-assigned U.S. patent application Ser. No. 12/455,763 that utilizes the host system RAM 14 for the mass storage memory 26 having a built-in file system, such as the FS 26A shown in FIG. 2. First the host system 10 sends a SHUTDOWN command to the mass storage memory device 20 (operation 4-1). Next the mass storage memory device 20 allocates RAM 14 from the host 10 and then loads (stores using a RAM WRITE command) all vital 'static' file system-related data (meta-data 24A) into host RAM 14 (operation 4-2). 'Static' data in this context may be, for example, various bitmaps, such as an allocation bitmap in the exFAT or ext3 file systems. This data may be processed (e.g., at least one of sorted, arranged and filtered) by the CPU 12 (controller) of the host device, and may include data from a large number of sectors in the mass storage memory 26. Mass memory storage device 20 may then send a shutdown OK indication (operation 4-3). The host 10 can remove power from the mass memory storage device 20, and the device 20 may be physically removed from the MSMB 18. Re-initialization (operations 4-4, 4-5, 4-6) of the mass storage memory device 20 is performed when host device 10 needs to get/put certain data from or into the mass storage memory device 20. Re-initialization of the mass storage memory 26 (and the file system 26A) may be sped up by using the sorted/arranged/filtered read data from the RAM 14. When the re-initialization operation is completed the mass storage memory device 20 may de-allocate the used RAM 14 in the host device 10, or the RAM 14 may not be de-allocated thereby reserving the RAM space for future use by the mass storage memory device 20.

The allocation of host RAM 14 may occur differently in some embodiments. For example, the host device 10 may allocate RAM 14 dynamically and pass a 'pointer' to the allocated RAM to the mass storage memory device 20. It is then up to the controller 22 of the mass storage memory device 20 how to utilize the allocated host RAM 14. Note that in this embodiment an explicit allocation request from the mass storage memory device 20 may not be sent to the host device 10. Instead, the host device 10 may on its own initiative allocate a portion of the RAM 14, such as when it first detects the presence of the mass memory storage device 20. Of course, subsequent signaling between the mass storage memory device 20 and the host device 10 may be used to change the size of the allocated RAM 14 if the initial allocation is not sufficient for the needs of the controller 22. As another example of RAM 14 allocation, a portion of the RAM 14 may be allocated by the host 10 in a static manner and the mass storage memory device 20 then simply uses the same portion of the RAM 14 each time it needs to extend the RAM 24. In this case the mass storage memory device 20 may already have knowledge of the location/size of the allocated RAM 14, and a pointer is not needed to be sent from the host device 10.

Note that while it may typically be the case that the mass storage memory device 20 will receive an allocation of host memory to store contents of the volatile RAM 24, in general the allocation may be for storing data for any read/write memory contained within the mass storage memory device 20.

Having thus provided an overview of various non-limiting and exemplary embodiments of the invention described in the commonly-assigned U.S. patent application Ser. No. 12/455,763, a description is now made of the exemplary embodiments of this invention.

In a managed NAND memory (e.g., eMMC, SSD, UFS, microSD) the memory controller (such as the controller 22 shown in FIG. 2) takes care of the flash management functions such as bad block management and wear leveling. In a typical low cost implementation there is only a small input/output (TO) buffer SRAM in the managedNAND. Embedded in the controller in higher end managedNANDs such as SSDs there may be tens to hundreds of megabits of discrete DRAM as cache. In the future some new memory technologies such as MRAM could serve as very fast non-volatile cache also.

In a modern multi-tasking mobile device environment there may be many different types of accesses from different initiators that are queued to the mass storage at the same time. In the eMMC case the queued accesses would be served one-by-one since the eMMC device can only handle a single thread at a time. In the UFS case it is possible to send the accesses/commands to a UFS device queue. However, even though the commands can be queued this does not ensure that there necessarily are sufficient resources at the UFS device (especially in a cost optimized model) to immediately accommodate all of the data related to the queued accesses.

The above described commonly-assigned U.S. patent application Ser. No. 12/455,763 provides a model in which the mass storage memory 20 is provided with read/write access to the system DRAM 14. This concept is extended by the exemplary embodiments of this invention to enable the mass storage memory 20 to move data within the system DRAM, either logically (by the use of pointers) or physically. The actual move could occur within the DRAM 14 or the data could travel back and forth over the system DRAM bus 17 (e.g., between the system DRAM 14 and a Mass Memory Host Controller 13 DMA buffer). The Mass Memory Host Controller 13, shown in FIG. 5A and described in detail below, can be considered to function in this regard as a DMA master and thus can include its own associated DMA data buffers for this purpose.

The foregoing features can be realized through the use of several embodiments.

In a first embodiment a separate physical address space in the system DRAM 14 is reserved for the mass storage memory 20, or a logical space is reserved if the system DRAM 14 operates in a logical address space. The mass storage memory (such as the UFS mass storage memory 20) can utilize this address space freely, and is responsible for the management functions of this address space such as allocation/deallocation functions and other functions.

Figure 5A:
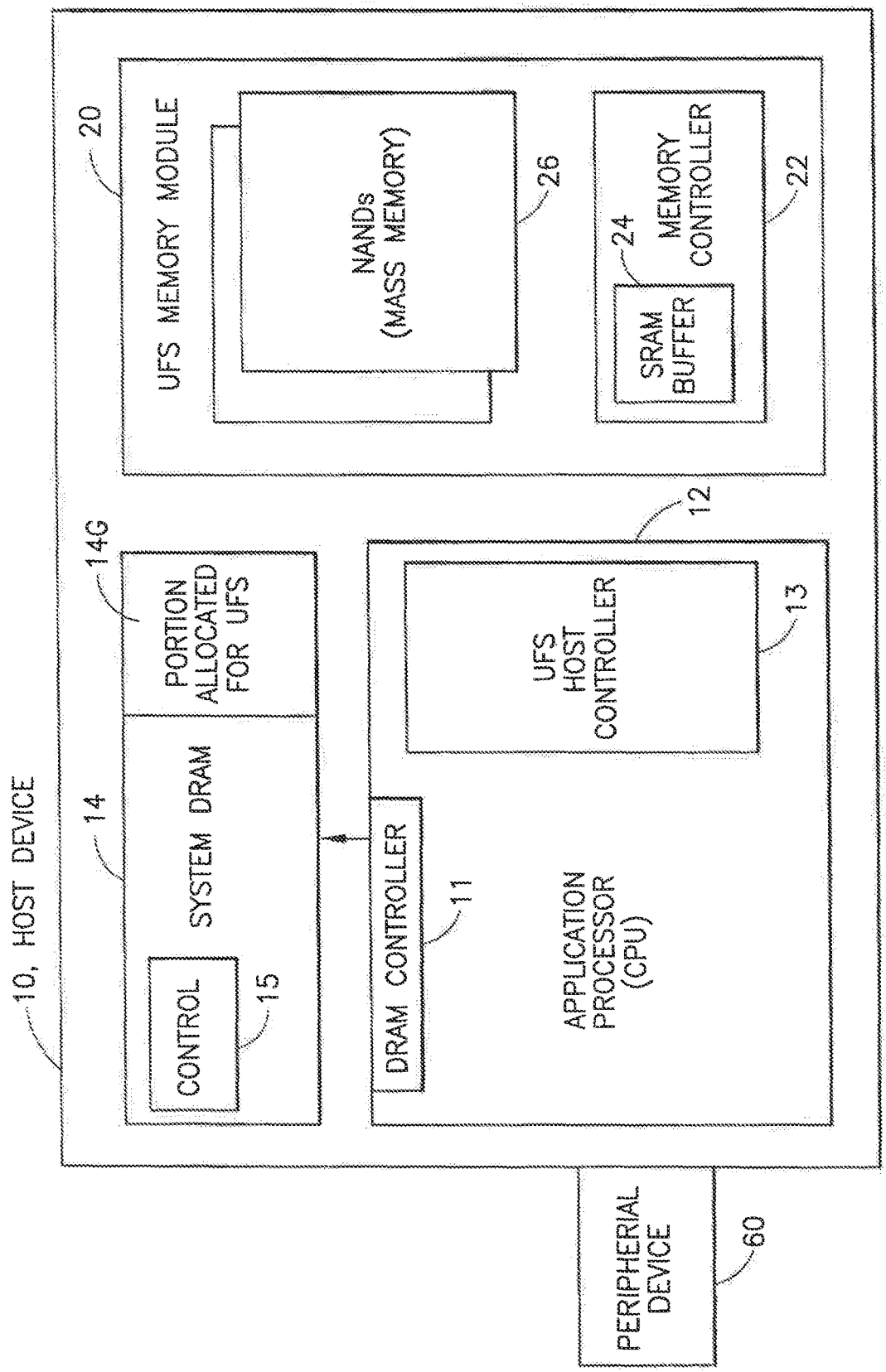

Reference can be made to FIG. 5 where those components described in reference to FIG. 2 are numbered accordingly. In FIGS. 5A, 5B and 5C a portion 14G of the system DRAM 14 is allocated for use by the mass memory module 20 (described here in a non-limiting embodiment as a UFS memory module). The host device 10 includes an application processor that can be embodied as the CPU 12. Included with or coupled to the application processor 12 may be a DRAM controller 11. Also present is the above-mentioned mass memory module (e.g., UFS) host controller 13. The host controller 13 can be embodied as the CPU 12 or it can be embodied as a separate device. FIG. 5B shows that the system DRAM 14 stores an operating system (OS) 14A and application programs (applications) 14B. At least some of the applications 14B generate data 14B'. The system DRAM 14 also typically stores a file system cache 14C associated with a file system (part of the OS 14A). In the embodiment of FIG. 5B a portion of the system DRAM 14 is allocated as a transfer buffer 14D to which the application data 14B' can be moved to become transfer buffer data 14E. Another portion of the system DRAM 14 is allocated to store an access list 14F. Also included is the DRAM portion 14G that is allocated for the UFS memory module 20, and into which the transfer buffer data 14E can be moved to become data 14E'. The operation of these components shown in FIGS. 5A, 5B and 5C is now described in further detail.

Assume that a source of data such as an application 14B, or a file system cache, or a file cache entity (as non-limiting examples) has data 14B' to be stored into the mass memory module 20. The data 14B' is moved to the transfer buffer 14D as the transfer data 14E by a file system/driver for subsequent delivery to the mass memory module 20. Optionally, as shown in FIG. 5C and discussed in further detail below, the data 14B' could be moved directly from its original location thereby bypassing the transfer buffer 14D. The access list 14F is created in the system DRAM 14 for the application 14B such as by an OS utility and points to the location of the data 14E. Note in this regard that an "application" (if understood here in a conventional sense as a third party application) cannot itself create any access lists. Instead the application creates read/write accesses and functions as an initiator. The access lists are created typically by some OS services/memory subsystem (e.g. some driver layer or some OS utility) based on accesses coming through the file system layer. In effect the access lists are constructed or built for the application. An initiator may be, as a non-limiting example, an application, a file system, a driver or an OS utility.

In accordance with an aspect of this invention the data 14E can be moved to the portion 14G allocated for the mass memory (UFS) to become the data 14E' as described below.

An access may take place by the host device 10 as follows (it is assumed that the host device 10 has already correctly initiated the mass storage memory 20).

(1) An initiator, such as an application program 14B resident in the system DRAM 14 that is being executed by the CPU 12, has built for itself (e.g., by an OS utility) a table of accesses (access list 14F) to the UFS memory module 20 in the system DRAM 14. Assume for this example that the execution of these accesses would exhaust the resources of the UFS memory module 20 for some period of time.

(2) The initiator, such as the application program 14B or the OS utility, informs the UFS host controller 13 of the presence of the table of accesses (access list 14F) and the host controller 13 begins the delivery of the commands and any related data to the UFS memory module 20.

(3) The same or another initiator, such as the same or a different application program 14B, has built for itself another table of write accesses (another access list 14F) to the UFS memory module 20 in the system DRAM 14 and the UFS host controller 13 is informed of the presence of the table of accesses.

(4) The UFS host controller 13 transfers this set of (write) commands to the UFS memory module 20. Assume that the UFS memory module 20 determines that it is not currently able to handle the data related to the write commands locally in the UFS memory module 20. Note in this regard that there could be, for example, ahead of queue indication by the initiator related to the commands to emphasize the urgency for the execution of the write command(s), and the UFS memory module 20 determines that it is not currently able to meet the indicated level of urgency.

(5) Instead of receiving the data related to the write commands the UFS memory module 20 moves the data e.g. from the transfer buffer 14D (or 14B/14C) to the reserved separate physical address space (allocated portion 14G) of the system DRAM 14. The move operation and the allocated portion 14G of the system DRAM 14 is controlled by the UFS memory module 20 via the UFS host controller 13. The UFS host controller 13 controls the system DRAM 14, or the system DRAM controller 11, to execute the move of the data 14E from e.g. the transfer buffer 14D to the allocated portion 14G as the data 14E'. The UFS host controller 13 can be assumed to perform this operation e.g. by means of operating as DMA master (of either a dedicated UFS DMA or system DMA) directly and can bypass the host CPU 12.

(6) After the physical move of the data 14E to the allocated portion 14G occurs the UFS memory module 20 can respond to the original (write) command as though it had actually moved the data to the non-volatile memory (NVM), i.e., to the mass memory 26. As a result the second initiator can consider that the write command(s) to the mass memory 20 have been executed and can continue its processing operations, even though the write data is currently resident as the data 14E' in the allocated portion 14G of the system DRAM 14.

(7) At some future time the UFS memory module 20 has sufficient resources to process the write command from the second initiator. At this time it independently fetches the data from the system DRAM 14 (from the allocated portion 14G of the system DRAM 14) and stores it in the NVM mass memory 26. From the point of view of the initiator or the file system layer of the OS 14A this operation is transparent, and appears as though there is physical DRAM/SRAM cache within the UFS memory module 20. That is, the external allocated portion 14G of the system DRAM 14 can function in a manner analogous to a virtual DRAM/SRAM cache of the UFS memory module 20.

Note that the UFS memory module 20 need not process received access commands sequentially. For example, before processing the write command from the second initiator if another write command having a higher indicated priority arrives from a third initiator, where the write data has also been stored in the allocated portion 14G, the UFS memory module 20 could process the write command from the third initiator and then process the write command from the second initiator.

In another embodiment there need be no specific separate memory addresses reserved in the system DRAM 14 for the mass memory module 20. Instead the mass memory module 20 can have access to any (or almost any) location in the system DRAM 14. In this case instead of moving data physically in the system DRAM 14 the mass memory module 20 can control a list of memory pointers created by the host CPU 12. By modifying the lists of pointers (one list of pointers for host and another for the mass memory module 20) the mass memory module 20 can virtually "move" data from host CPU-controlled logical memory space to space controlled by the mass memory module 20. Note that in this case the transfer buffer 14D will/may still be present, however there is no need for the physical portion 14G allocated for the mass memory module 20.

Alternatively, the mass memory module 20 can use header information created by the host CPU 12. The header information can use separate bits for host valid/invalid, reserved and mass memory valid/invalid allocations and can be stored in the system DRAM 14. In this case by modifying the header information (e.g., allocated/free) the mass memory module 20 could "move" data from host CPU 12 controlled addresses to addresses controlled by the mass memory module 20.

Either or both of these operations can be mediated by the host controller 13.

There can be a read command from an application to an address of which the data is still located in an area of the system DRAM 14 reserved for the non-volatile module 14G, i.e. the data stored earlier was not yet moved by the non-volatile memory module 20 to the non-volatile memory 26. In such a case the memory controller 22 would detect this read command and (instead of truly moving and storing the data into the non-volatile memory 26 before serving the read command) would copy (not move) the data from the memory area 14G to the location reserved for it in the file cache/file system cache 14C/transfer buffer 14D or application area 14B. The target address in the reserved location could be included in the access list 14F so that it is at least known by the host controller 13.

In the alternative embodiments related to modification of lists of pointers and headers correspondingly the above mentioned read case would be realized as copying of the data (related to the read request) to new target location and preparing the pointers/headers by the memory module/host controller so that the copied data will be immediately accessible and under control of the host system 10.

In all of these read-related embodiments it should be appreciated that the read data is copied and the data 14E' still exists and will be written to the non-volatile memory 26 of the memory module 20 as soon as the memory controller 22 has the resources to perform the write operation.

FIG. 5C shows an embodiment of this invention, as discussed above, where the access list 14F references the data 14B', and the referenced data is then directly moved to the allocated portion (as data 14E') thereby bypassing the transfer buffer 14D (i.e., the data 14B' after being moved directly becomes the data 14E').

It is also within the scope of the exemplary embodiments for the data to originate from a source other than the host CPU 12 (e.g., other than from the application processor). For example, the data could originate from an initiator that is embodied as a peripheral device 60 that is connected to the host device 10 either by a wired connection or a wireless connection. In this case instead of moving the data directly from the peripheral device 60 to the mass memory module 20 the mass memory module 20 causes the data to be stored in the system DRAM 14, such as in the allocated portion 14G. The data that originates at the peripheral device 60 is thus temporarily (and transparently to the peripheral device 60) cached in the system DRAM 14.

Further in accordance with the exemplary embodiments of this invention the operation of the DRAM 14 is enhanced by providing additional functionality to locally perform operations in the DRAM 14.

By way of introduction, one of the processing capacity bottlenecks of a wireless terminal (e.g., a smartphone) is the execution memory, especially the memory bus. While the execution memory, also known as work memory, is a separate component (e.g., external DRAM), it is connected to a host ASIC by a bus that has a limited transfer capacity (bandwidth).

The means of improving the memory bandwidth are limited. In most cases the cost of several memory buses and memory devices respectively is too high. Also the bus itself takes a major portion of the pin/pad budget of the host ASIC, meaning that at a given pad pitch, the package containing the host ASIC silicon, would became unnecessarily large with multiple buses, creating problems for miniaturization efforts.

A common problem is that the memory bandwidth, or transaction capacity, is not sufficient for many desired use cases. The host ASIC can contain several memory masters (e.g., processors, accelerators, and DMA engines) and one DRAM controller 11 that provides the external memory bus. At the other end of this bus is the memory device (DRAM component). Memory masters issue read and write requests to the memory. The DRAM is built of several banks (4 to 8 typically) that could operate in parallel. Thus, while parallelism exists at both ends of the memory bus, the memory bus itself is a single-threaded arrangement.

The exemplary aspects of this invention include providing a means to fully exploit the memory device by enabling internal operations to be performed locally. This improves the overall memory subsystem performance, enhances CPU capacity by off-loading some operations from the CPU, and decreases power consumption. The exemplary aspects of this invention provide for some elementary operations to be carried out by the memory device through the use of an enhanced command set.

It should be noted that while these aspects of the exemplary embodiments of this invention are described in the context of enhancing the operation of the system DRAM 14 these aspects of the invention could be applied as well to enhancing the operation of the mass storage memory device 20. For example, the resident memory controller 22 of the memory module 20 could be modified so as to provide local autonomous operations within the mass memory 26.

Further in accordance with the exemplary embodiments of this invention some basic, elemental functions such as memory fill and memory move are handled internally to the system DRAM 14. These operations can be handled, for example, by system DRAM memory controller and/or by a control module or function 15 embedded in the system DRAM 14 (shown in FIG. 5A).

In this embodiment the system DRAM 14, with or without assistance of the system DRAM memory controller 11, can perform, for example, memory fill and move function(s) independently and autonomously without active intervention/control by the CPU 12. This reduces the CPU 12 and system DRAM bus 17 load due at least to the mass memory module/mass memory host controller 13 controlling the physical data move from the buffer 14B/14D to the allocated portion 14G.

It can be shown that many memory transactions are simple fills of memory address space with data (e.g., zeroes) or moving data chunks from one memory location into another memory location, where the locations can be inside the same physical memory device or inside two different memory devices. This conventionally requires activity at the CPU level, which means that system processing efficiency and power consumption are less than optimal.

In accordance with these further aspects of the invention at least some elementary in-memory operations are removed from the responsibility of the CPU 12 and transferred to the system DRAM 14, such as to the controller 15 that can be embedded with the system DRAM 14.

In this exemplary embodiment the controller 15 functionality includes "smart memory" features. Alternatively these smart memory features could be included in the host controller 13 shown in FIG. 5A. Alternatively, and as was mentioned above, these smart memory features could also be included in the system DRAM memory controller 11 functionality for the system DRAM 14 of the host device 10.

In these embodiments system DRAM controller 11 or the system DRAM module (control 15) may analyse commands issued for it and initiate a "smart memory" operation such as a memory fill or a memory move operation.

The additional functionality added to, for example, the controller 15 may include at least a data fill feature and a data move feature. The additional functionality optionally includes security functions for the system DRAM 14, pack/unpack functions between the system DRAM 14 and the mass memory 26, data transaction functions between the DRAM 14 and the mass memory 26 and, for example, mass memory related error detection and correction and wear levelling functions.

As an example of the use of the smart memory features, a memory block reset is typically performed by writing zeroes into the memory. In accordance with this invention a 'data fill' function supports at least a Fill operation using any specified bit pattern (e.g., Fill: Data), where Data could be any specified bit pattern such as '0000', '1111', '0101', etc.

A Data Move operation can be a read/write (copy) sequence followed by a Fill operation to the region of system DRAM 14 from which the data was moved (read). The Fill operation could set the memory locations to some predetermined value (e.g., zero), or to a value specified by the Data Move operation command in a manner analogous to the Fill operation discussed above. The Fill operation can be optional, so that the Data Move operation functions as a Data Copy operation (i.e., the data is replicated to another location while the original data is unchanged).

A non-limiting example of the implementation of the smart memory functionality at the command level is as follows.

Low Power Double Data Rate (LPDDR1 (LP1)) as specified by JEDEC (e.g., see JEDEC Standard, Low Power Double Data Rate (LPDDR) SDRAM Standard, JESD209B, February 2010) does not provide a straightforward method of adding these types of smart features. An exemplary implementation may be to use a sequence of multiple conventional Mode Register Set (MRS) commands (MRS with bank address BA0=BA1='1' is available) using address pins A0-Ax to deliver the following information to the memory device:

1) Command type (move, fill);
2) Fill data (all 0, all 1, 01 sequence, . . . ), optional;
3) Target address (fill, move) and source address (move), address depends on implementation;
4) Operation size, granularity depends on implementation.

The number of needed MRS commands in the sequence is dependent on addressing, data granularity and operation size, which are implementation dependant factors. In LPDDR2 and LPDDR3 Mode Register Write commands could be used in a similar fashion. It should be understood that conventional LPDDRx solutions allow MRS and MRW operation only from DRAM idle state, but other solutions are technically possible. One such implementation may be to require that the data which is the source or the target of the move or fill operation is located in open DRAM pages.

It should also be understood that with future DRAM interfaces new dedicated commands are possible to be used for these operations—and these operations could be made much more efficient. Fundamentally from a system viewpoint some or all of the following operations may be delivered to the memory:

1) Deliver command (fill0, fill1, . . . , fill_pattern, move);
2) Deliver target address (bank, row, column, byte);
3) Deliver source address (bank, row, column, byte);
4) Deliver operation size.

Full command and address delivery may occur in a single or a multiple command sequence—a certain command code may, for example, indicate multicycle delivery via cmd/address/data bus as suits the implementation. The particular implementation dictates the requirements for the data and address granularity, requirements for the memory state prior to and after the smart memory feature operations, whether the memory internally uses some intermediate buffers to move or fill the data or whether open rows (DRAM sense amps) are reserved during the entire operation, any timing requirements, etc.

The command could be issued by the, for example, the CPU 12 (e.g., by an OS or file system utility) or by the mass memory host controller 13 and then autonomously executed by the controller 15 associated with the system DRAM 14 or by the DRAM memory controller 11.

There are a number of advantages and technical effects that can be realized by the use of the exemplary embodiments of this invention as described above. For example, a faster response to the initiator (Host CPU 12, a process, an initiator, an application) can be provided that an access has been served (actually taken into the ManagedNAND side for further processing). This enhances the user experience. Further, no changes need be made to the upper layer software (e.g., file system and/or applications) as moving data occurs at a low layer of hardware/software. Further, the allocated portion 14G of the system DRAM 14 for the ManagedNAND functionality need not be excessively large. For example, for many uses of interest some hundreds of kilobytes could be sufficient as in many cases it would be most advantageous to temporarily cache just small random accesses, and to store directly to the non-volatile mass memory 26 larger sequential accesses. In addition, the use of the further aspects of this invention enable certain elementary memory operations (e.g., fill, move) to be accomplished locally (e.g., within the system DRAM module 14) without active involvement of the CPU 12.

Figure 6:
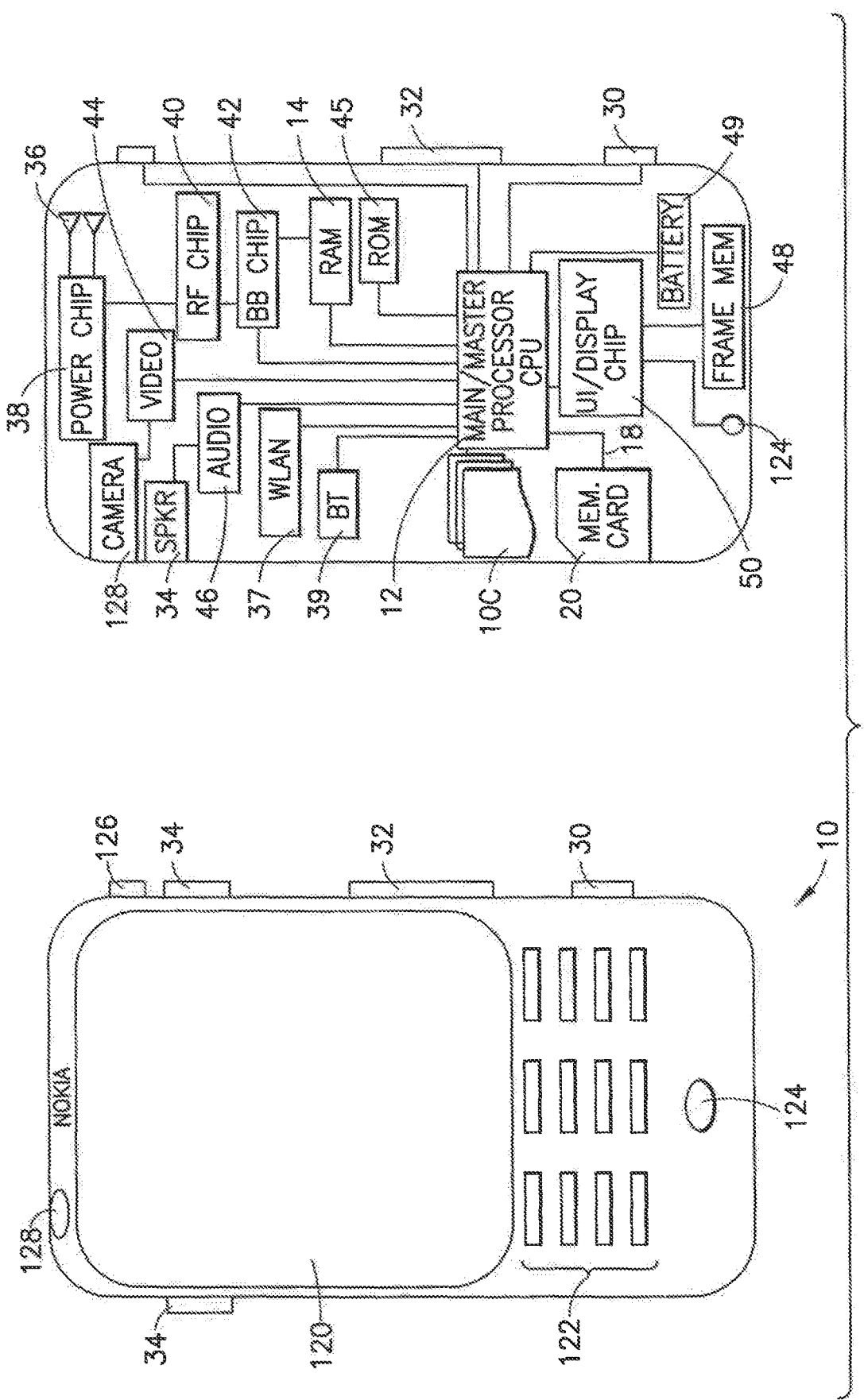
FIG. 6 shows a block diagram of one exemplary embodiment of the host device when embodied as a wireless communication device.

FIG. 6 illustrates one non-limiting embodiment of the host device 10 used with the mass storage memory device 20, referred to in FIG. 6 simply as a memory card 20. The mass storage memory device 20 can be removable or it can be embedded in the device 10. In this exemplary embodiment the host device 10 is embodied as a user equipment (UE), shown in both plan view (left) and sectional view (right). In FIG. 6 the host device (UE) 10 has a graphical display interface 120 and a user interface 122 illustrated as a keypad but understood as also encompassing touch screen technology at the graphical display interface 120 and voice recognition technology received at a microphone 124. A power actuator 126 controls the device being turned on and off by the user. The exemplary UE 10 may have a camera 128 which is shown as being forward facing (e.g., for video calls) but may alternatively or additionally be rearward facing (e.g., for capturing images and video for local storage). The camera 128 is controlled by a shutter actuator 30 and optionally by a zoom actuator 32 which may alternatively function as a volume adjustment for the speaker(s) 34 when the camera 128 is not in an active mode.

As an example, image data captured by the camera 128 can be stored in the mass storage memory device 20 under control of a camera application and can thus benefit from the use of the embodiments of this invention. As another example, audio data captured by the microphone 124 can be stored in the mass storage memory device 20 under control of an audio application and can thus also benefit from the use of the embodiments of this invention.

Within the sectional view of FIG. 6 are seen multiple transmit/receive antennas 36 that are typically used for cellular communication. The antennas 36 may be multi-band for use with other radios in the UE. The operable ground plane for the antennas 36 is shown by shading as spanning the entire space enclosed by the UE housing though in some embodiments the ground plane may be limited to a smaller area, such as disposed on a printed wiring board on which the power chip 38 is formed. The power chip 38 controls power amplification on the channels being transmitted and/or across the antennas that transmit simultaneously where spatial diversity is used, and amplifies the received signals. The power chip 38 outputs the amplified received signal to a radio frequency (RF) chip 40 which demodulates and downconverts the signal for baseband processing. A baseband (BB) chip 42 detects the signal which is then converted to a bit stream and finally decoded. Similar processing occurs in reverse for signals generated in the host device 10 and transmitted from it.

Signals going to and from the camera 128 may pass through an image/video processor 44 that encodes and decodes the various image frames. A separate audio processor 46 may also be present controlling signals to and from the speakers 34 and the microphone 124. The graphical display interface 120 is refreshed from a frame memory 48 as controlled by a user interface chip 50 which may process signals to and from the display interface 20 and/or additionally process user inputs from the keypad 22 and elsewhere.

Certain embodiments of the UE 10 may also include one or more secondary radios such as a wireless local area network radio WLAN 37 and a Bluetooth7 radio 39, which may incorporate an antenna on the chip or be coupled to an antenna off the chip. Throughout the apparatus are various memories such as random access memory RAM, which can include the system DRAM 14, read only memory ROM 45, and in some embodiments removable memory such as the illustrated memory card 20 on which various programs and data may be stored. All of these components within the UE 10 are normally powered by a portable power supply such as a battery 49.

The processors 38, 40, 42, 44, 46, 50, if embodied as separate entities in a UE 10, may operate in a slave relationship to the main processor (CPU) 12, which may then be in a master relationship to them. Certain embodiments may be disposed across various chips and memories as shown, or disposed within another processor that combines some of the functions described above for FIG. 6. Any or all of these various processors of FIG. 6 access one or more of the various memories, which may be on chip with the processor or separate from the chip with the processor. Note that the various integrated circuits (e.g., chips 38, 40, 42, etc.) that were described above may be combined into a fewer number than described and, in a most compact case, may all be embodied physically within a single chip.

In this exemplary embodiment the CPU 12 of the UE 10 (the host device) operates with the memory card 20 (the mass storage memory device) as described above with respect to FIGS. 5A, 5B and 5C so that the memory card 20 can be extended to use at least a portion of the system Dynamic RAM 14 of the UE 10 as described above.

Figure 7:
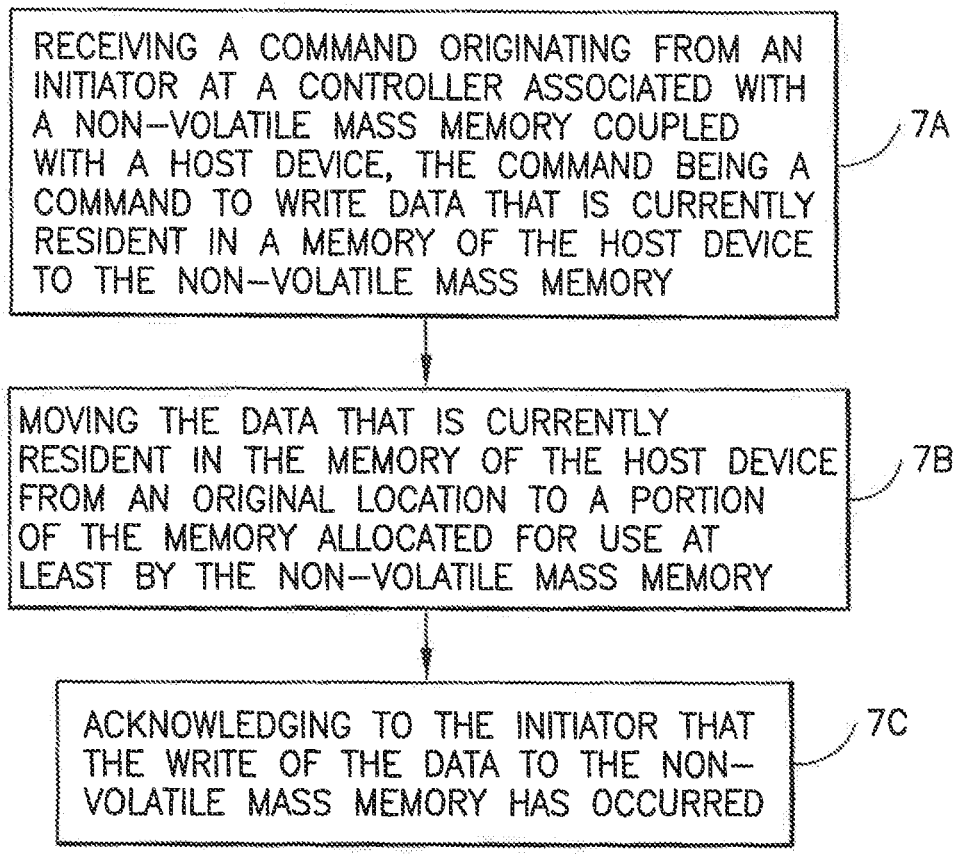
FIG. 7 is a logic flow diagram that illustrates the operation of a method, and a result of execution of computer program instructions embodied on a computer readable memory, in accordance with the exemplary embodiments of this invention.

An aspect of the exemplary embodiments of this invention is a method, shown in FIG. 7, that includes (7A) receiving a command (the command can arrive, for example, via a file system layer (SW) and a driver layer (SW) and a host controller (HW)) originating from an initiator (e.g., an application, a file system, a driver or an OS utility) at a controller (e.g., a memory controller) associated with a non-volatile mass memory coupled with a host device. The command is a command to write data that is currently resident in a memory of the host device to the non-volatile mass memory. The memory of the host device may comprise, as non-limiting examples, DRAM, MRAM, PCM (phase change memory), RRAM (resistive random access memory), magnetic random access memory, ferroelectric random access memory and the like. The method further includes (7B) moving the data that is currently resident in the memory of the host device from an original location to a portion of the memory allocated for use at least by the non-volatile mass memory. The method further includes (7C) acknowledging to the initiator that the command to write the data to the non-volatile mass memory has been executed In the method described in FIG. 7 and the preceding paragraph, further comprising, subsequent to acknowledging, moving the data from the memory of the host device to the non-volatile mass memory.

In the method described in FIG. 7 and the preceding paragraphs, where the data is physically moved to the portion of the memory that is allocated for use at least by the non-volatile mass memory.

In the method described in FIG. 7 and the preceding paragraphs, where the data is logically moved to the portion of the memory that is allocated for use at least by the non-volatile mass memory by changing a value of a memory address pointer to the data or a value of a header of the data.

In the method described in FIG. 7 and the preceding paragraphs where the data originates with the initiator and where the initiator is resident in the host device.

In the method described in FIG. 7 and the preceding paragraph, where the initiator comprises at least one of an application program, a file system, a driver, and an operating system utility.

In the method described in FIG. 7 and the preceding paragraphs, where the data originates with the initiator and where the initiator is external to the host device.

In the method described in FIG. 7 and the preceding paragraph, where the initiator is embodied as a peripheral device that is connected with the host device.

In the method described in FIG. 7 and the preceding paragraphs, where the memory of the host device comprises a dynamic random access memory, and further comprising autonomously performing an elementary memory operation in the memory of the host device.

In the method described in FIG. 7 and the preceding paragraph, where the elementary memory operation is a data fill operation to set a specified plurality of memory locations to a specified value.

In the method described in FIG. 7 and the preceding paragraphs, where the elementary memory operation is a data move operation to move data from a first specified plurality of memory locations to a second specified plurality of memory locations.

In the method described in FIG. 7 and the preceding paragraph, where the data move operation further comprises setting the first specified plurality of memory locations to a predetermined value.

In the method described in FIG. 7 and the preceding paragraphs, further comprising while the data is resident in the portion of the memory allocated for use at least by the non-volatile mass memory, responding to a read command for the data to read the data resident in the portion of the memory allocated for use by the non-volatile mass memory and copying the read data to an initiator of the read command.

In the method described in FIG. 7 and the preceding paragraphs, where moving the data that is currently resident in the memory of the host device from an original location to a portion of the memory allocated for use at least by the non-volatile mass memory is initiated by the controller associated with the non-volatile mass memory.

In the method described in FIG. 7 and the preceding paragraphs, where the method is performed as a result of execution of computer program instructions by the controller.

Figure 8:
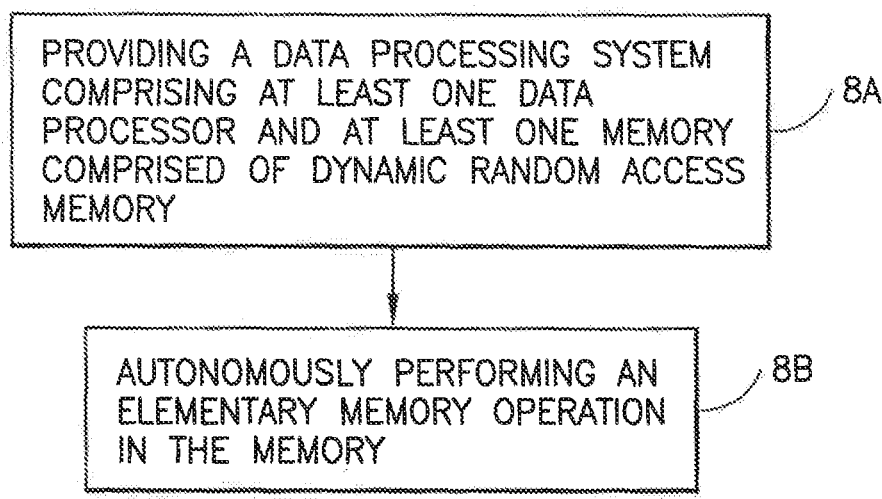
FIG. 8 is a logic flow diagram that illustrates the operation of a method, and a result of execution of computer program instructions embodied on a computer readable memory, further in accordance with the exemplary embodiments of this invention.

FIG. 8 is a logic flow diagram that illustrates the operation of a method, and a result of execution of computer program instructions embodied on a computer readable memory, further in accordance with the exemplary embodiments of this invention. In accordance with these exemplary embodiments a method performs, at Block 8A, providing a data processing system comprising at least one data processor and at least one memory comprised of dynamic random access memory. At Block 8B there is a step of autonomously performing an elementary memory operation in the memory.

In the method described in FIG. 8 and the preceding paragraph, where the elementary memory operation is a data fill operation to set a specified plurality of memory locations to a specified value.

In the method described in FIG. 8 and the preceding paragraphs, where the elementary memory operation is a data move operation to move data from a first specified plurality of memory locations to a second specified plurality of memory locations.

In the method described in FIG. 8 and the preceding paragraph, where the data move operation further comprises setting the first specified plurality of memory locations to a predetermined value.

The various blocks shown in FIGS. 7 and 8 may be viewed as method steps, and/or as operations that result from operation of computer program code, and/or as a plurality of coupled logic circuit elements constructed to carry out the associated function(s).

In general, the various exemplary embodiments may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the exemplary embodiments of this invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

It should thus be appreciated that at least some aspects of the exemplary embodiments of the inventions may be practiced in various components such as integrated circuit chips and modules, and that the exemplary embodiments of this invention may be realized in an apparatus that is embodied as an integrated circuit. The integrated circuit, or circuits, may comprise circuitry (as well as possibly firmware) for embodying at least one or more of a data processor or data processors, a digital signal processor or processors, baseband circuitry and radio frequency circuitry that are configurable so as to operate in accordance with the exemplary embodiments of this invention.

An apparatus in accordance with the exemplary embodiments includes means for sending a command from a host device to a controller associated with a non-volatile mass memory coupled with the host device, the command being a command to write data that is currently resident in a memory of the host device to the non-volatile mass memory; means for moving the data that is currently resident in the memory of the host device from an original location to a portion of the memory allocated for use by the non-volatile mass memory; and means for acknowledging to the host device that the command to write the data to the non-volatile mass memory has been executed.

Various modifications and adaptations to the foregoing exemplary embodiments of this invention may become apparent to those skilled in the relevant arts in view of the foregoing description, when read in conjunction with the accompanying drawings. However, any and all modifications will still fall within the scope of the non-limiting and exemplary embodiments of this invention.

It should be noted that the terms "connected," "coupled," or any variant thereof, mean any connection or coupling, either direct or indirect, between two or more elements, and may encompass the presence of one or more intermediate elements between two elements that are "connected" or "coupled" together. The coupling or connection between the elements can be physical, logical, or a combination thereof. As employed herein two elements may be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Furthermore, some of the features of the various non-limiting and exemplary embodiments of this invention may be used to advantage without the corresponding use of other features. As such, the foregoing description should be considered as merely illustrative of the principles, teachings and exemplary embodiments of this invention, and not in limitation thereof.

What is claimed is:

1. A memory module comprising:
   a control module;
   a memory that is readable and writable by the control module; and
   an interface for connecting the memory module to a memory controller of a host device;
   the control module configured to:
      receive, from the memory controller of the host device, a command to perform a data move operation on data stored in an original location of the memory followed by a data fill operation on the original location of the memory, the command indicating a source address of the original location and a target address associated with a portion of the memory;
      perform, responsive to the command and based at least in part on the source address and the target address, the data move operation on the memory; and
      perform, responsive to the command and based at least in part on the source address, the data fill operation on the original location of the memory, wherein the data fill operation comprises setting the original location of the memory to at least one of a predetermined value stored in the memory module or one or more values included in the command.

2. The memory module of claim 1, the control module further configured to perform the data move operation and the data fill operation in the memory module autonomously following receipt of the command.

3. The memory module of claim 1, the control module further configured to determine a fill pattern based at least in part on the one or more values included in the command.

4. The memory module of claim 1, the control module further configured to determine a fill pattern to set the original location of the memory based at least in part on the predetermined value stored in the memory module.

5. The memory module of claim 1, the data move operation including copying the data from the original location of the memory to the portion of the memory.

6. The memory module of claim 1, wherein the memory module is one of a dynamic random access memory (DRAM) module or a mass memory module.

7. The memory module of claim 1, wherein the predetermined value stored in the memory module or the one or more values included in the command are at least one of a single zero bit, a single one bit, a first pattern of two bits, a second pattern of four bits, or a third pattern of a plurality of bits.

8. A method comprising:
   receiving, from a memory controller of a host device, a command to perform a data move operation on data stored in an original location of a memory followed by a data fill operation on the original location of the memory, the command indicating a source address of the original location and a target address associated with a portion of the memory;
   performing, responsive to the command and based at least in part on the source address and the target address, the data move operation on the memory; and
   performing, responsive to the command and based at least in part on the source address, the data fill operation on the original location of the memory, wherein the data fill operation comprises setting the original location of the memory to at least one of a predetermined value stored in the memory or one or more values included in the command.

9. The method of claim 8, further comprising performing the data move operation and the data fill operation autonomously following receipt of the command.

10. The method of claim 8, further comprising determining a fill pattern to set the original location of the memory based at least in part on the one or more values included in the command.

11. The method of claim 8, further comprising determining a fill pattern to set the original location of the memory based at least in part on the predetermined value stored in the memory.

12. The method of claim 8, the data move operation including copying the data from the original location of the memory to the portion of the memory.

13. The method of claim 8, wherein the data move operation is performed on a specified plurality of memory locations in the memory, wherein the specified plurality of memory locations include the original location of the memory.

14. A host apparatus comprising:
   a memory controller; and
   an interface for connecting the memory controller to a memory module;
   the memory controller configured to:
      transmit, to the memory module, a command associated with data stored in a memory of the memory module thereby causing the memory module, responsive to the command, to perform two or more elementary memory operations within the memory module, wherein the two or more elementary memory operations include a data move operation on data stored in an original location of memory and a configurable data fill operation in the original location of memory, the command indicating a source address of the original location and a target address associated with a portion of the memory, and
      wherein the memory controller is controlled by one of a mass memory module or a mass memory host controller.

15. The host apparatus of claim 14, further comprising the mass memory host controller, wherein the command is initiated by the mass memory host controller and transmitted to the memory module by the memory controller via the interface.

16. The host apparatus of claim 14, wherein the configurable data fill operation includes setting a specified plurality of memory locations in the memory to a specified value, the specified plurality of memory locations including the original location of memory.

17. The host apparatus of claim 16, the memory controller further configured to transmit a fill pattern to the memory module to set the specified plurality of memory locations in the memory to the specified value.

18. The host apparatus of claim 14, wherein the data move operation includes copying the data from a first specified plurality of memory locations in the memory to a second specified plurality of memory locations, the first specified plurality of memory locations including the original location of memory.

19. The host apparatus of claim 18, wherein the data move operation further includes setting the first specified plurality of memory locations in the memory to a predetermined value.

20. The host apparatus of claim 14, wherein the memory module is a dynamic random access memory (DRAM) module.

21. A dynamic random access memory (DRAM) memory module comprising:
   a control module;
   a memory that is readable and writable by the control module; and
   an interface for connecting the DRAM memory module to a memory controller of a host device;
   the control module configured to:
      receive, from the memory controller of the host device, a command to perform a data move operation on a plurality of original memory locations of the memory, followed by a data fill operation in the plurality of original memory locations;
      determine, responsive to the command, a fill pattern to set the plurality of original memory locations in the memory to a specified value, wherein the fill pattern is a received fill pattern included in the command from the memory controller of the host device; and
      perform, based at least in part on the command, the data move operation from the plurality of original memory locations, followed by the data fill operation, wherein the data fill operation includes setting the plurality of original memory locations in the memory to the specified value.

22. The DRAM memory module of claim 21, wherein the specified value is at least one of a single zero bit, a single one bit, a first pattern of two bits, a second pattern of four bits, or a third pattern of a plurality of bits.

* * * * *